United States Patent
Mathijssen et al.

(10) Patent No.: US 12,013,647 B2
(45) Date of Patent: Jun. 18, 2024

(54) METROLOGY METHOD

(71) Applicant: ASML Netherlands B.V., Veldhoven (NL)

(72) Inventors: Simon Gijsbert Josephus Mathijssen, Rosmalen (NL); Marc Johannes Noot, Eindhoven (NL); Kaustuve Bhattacharyya, Veldhoven (NL); Arie Jeffrey Den Boef, Waalre (NL); Grzegorz Grzela, Eindhoven (NL); Timothy Dugan Davis, Portland, OR (US); Olger Victor Zwier, Eindhoven (NL); Ralph Timotheus Huijgen, Hillsboro, OR (US); Peter David Engblom, Portland, OR (US); Jan-Willem Gemmink, Riethoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 367 days.

(21) Appl. No.: 17/419,648

(22) PCT Filed: Dec. 24, 2019

(86) PCT No.: PCT/EP2019/087015
§ 371 (c)(1),
(2) Date: Jun. 29, 2021

(87) PCT Pub. No.: WO2020/141140
PCT Pub. Date: Jul. 9, 2020

(65) Prior Publication Data
US 2022/0075276 A1     Mar. 10, 2022

Related U.S. Application Data

(60) Provisional application No. 62/787,196, filed on Dec. 31, 2018.

(51) Int. Cl.
   *G03F 7/00*     (2006.01)
   *G01N 21/47*     (2006.01)
   *G06T 7/00*     (2017.01)

(52) U.S. Cl.
CPC ......... *G03F 7/70633* (2013.01); *G01N 21/47* (2013.01); *G06T 7/0004* (2013.01);
(Continued)

(58) Field of Classification Search
CPC ............... G06F 7/70633; G01N 21/47; G01N 2021/4735; G01N 2021/8822; G01N 2021/8845; G06T 7/0004
See application file for complete search history.

(56) References Cited

U.S. PATENT DOCUMENTS

| | | |
|---|---|---|
| 5,452,090 A | 9/1995 | Progler et al. |
| 9,940,703 B2 | 4/2018 | Bozkurt et al. |

(Continued)

FOREIGN PATENT DOCUMENTS

| | | |
|---|---|---|
| CN | 109073995 A | 12/2018 |
| TW | 201614383 A | 4/2016 |

(Continued)

OTHER PUBLICATIONS

International Search Report and Written Opinion of the International Searching Authority directed to related International Patent Application No. PCT/EP2019/087015, dated Apr. 17, 2020; 8 pages.

(Continued)

*Primary Examiner* — Daniel G Mariam
(74) *Attorney, Agent, or Firm* — Sterne, Kessler, Goldstein & Fox P.L.L.C.

(57) ABSTRACT

A method provides the steps of receiving an image from a metrology tool, determining individual units of said image and discriminating the units which provide accurate metrol- (Continued)

ogy values. The images are obtained by measuring the metrology target at multiple wavelengths. The discrimination between the units, when these units are pixels in said image, is based on calculating a degree of similarity between said units.

12 Claims, 2 Drawing Sheets

(52) U.S. Cl.
CPC ............... *G01N 2021/4735* (2013.01); *G06T 2207/30148* (2013.01)

(56) References Cited

U.S. PATENT DOCUMENTS

| | | |
|---|---|---|
| 11,784,098 B2 | 10/2023 | Van Leest et al. |
| 2006/0066855 A1 | 3/2006 | Boef et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2012/0242940 A1 | 9/2012 | Nagata et al. |
| 2016/0161864 A1 | 6/2016 | Middlebrooks et al. |
| 2017/0076440 A1 | 3/2017 | Pandev et al. |
| 2017/0206642 A1 | 7/2017 | Rhead et al. |
| 2017/0206649 A1 | 7/2017 | Bozkurt et al. |
| 2017/0307983 A1 | 10/2017 | Den Boef et al. |
| 2018/0073866 A1 | 3/2018 | Tarabrin et al. |
| 2018/0292326 A1* | 10/2018 | Manassen .......... G01N 21/8806 |

FOREIGN PATENT DOCUMENTS

| WO | WO 2009/078708 A1 | 6/2009 |
|---|---|---|
| WO | WO 2009/106279 A1 | 9/2009 |

OTHER PUBLICATIONS

Chinese Office Action directed to Chinese Patent Application No. 201980087198.2, mailed Jan. 12, 2024; 13 pages.

\* cited by examiner

201'  202'

201  202

203  204

METROLOGY METHOD

CROSS-REFERENCE TO RELATED APPLICATIONS

This application claims priority of U.S. application 62/787,196 which was filed on Dec. 31, 2018 and which is incorporated herein in its entirety by reference.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Significant aspects to enabling a patterning process (i.e., a process of creating a device or other structure involving patterning (such as lithographic exposure or imprint), which may typically include one or more associated processing steps such as development of resist, etching, etc.) include developing the process itself, setting it up for monitoring and control and then actually monitoring and controlling the process itself. Assuming a configuration of the fundamentals of the patterning process, such as the patterning device pattern(s), the resist type(s), post-lithography process steps (such as the development, etch, etc.), it is desirable to setup an apparatus in the patterning process for transferring the pattern onto the substrates, develop one or more metrology targets to monitor the process, setup up a metrology process to measure the metrology targets and then implement a process of monitoring and/or controlling the process based on measurements.

So, in a patterning process, it is desirable to determine (e.g., measure, simulate using one or more models that model one or more aspects of the patterning process, etc.) one or more parameters of interest, such as the critical dimension (CD) of a structure, the overlay error between successive layers (i.e., the undesired and unintentional misalignment of successive layers) formed in or on the substrate, etc.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of inspection apparatus (e.g., metrology apparatus) have been developed for use in the lithographic field. For example, scatterometry devices direct a beam of radiation onto a target and measure one or more properties of the redirected (e.g., scattered) radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

A further technique involves having the zeroth order of diffraction (corresponding to a specular reflection) blocked, and only higher orders are processed. Examples of such metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety. Such diffraction-based techniques are typically used to measure overlay. The targets for techniques can be smaller than the illumination spot and may be surrounded by product structures on a substrate. A target can comprise multiple periodic structures, which can be measured in one image. In a particular form of such a metrology technique, overlay measurement results are obtained by measuring a target twice under certain conditions, while either rotating the target or changing the illumination mode or imaging mode to obtain separately the $-1^{st}$ and the $+1^{st}$ diffraction order intensities. The intensity asymmetry, a comparison of these diffraction order intensities, for a given target provides a measurement of target asymmetry, that is asymmetry in the target. This asymmetry in the target can be used as an indicator of overlay error.

So, as described, during the manufacturing process there is a need to inspect the manufactured structures and/or to measure one or more characteristics of the manufactured structures. Suitable inspection and metrology apparatuses are known in the art. One of the known metrology apparatuses is a scatterometer and, for example, a dark field scatterometer. U.S. patent application publication US 2016/0161864, U.S. patent application publication US 2010/0328655 and U.S. patent application publication US 2006/0066855 discuss embodiments of a photolithographic apparatus and embodiments of a scatterometer. The cited documents are herein incorporated by reference in their entirety.

Electronic devices, such as integrated circuits, are often manufactured by means of a manufacturing process in which layers are formed on top of each other on a substrate by means of several process steps. One of the process steps may be photolithography which may use electromagnetic radiation in the deep ultraviolet (DUV) spectral range or in the extreme ultraviolet (EUV) spectral range. The substrate is often a silicon wafer. The smallest dimensions of the manufactured structures are in the nanometer range.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable those skilled in the relevant art(s) to make and use aspects described herein.

Figure 1:
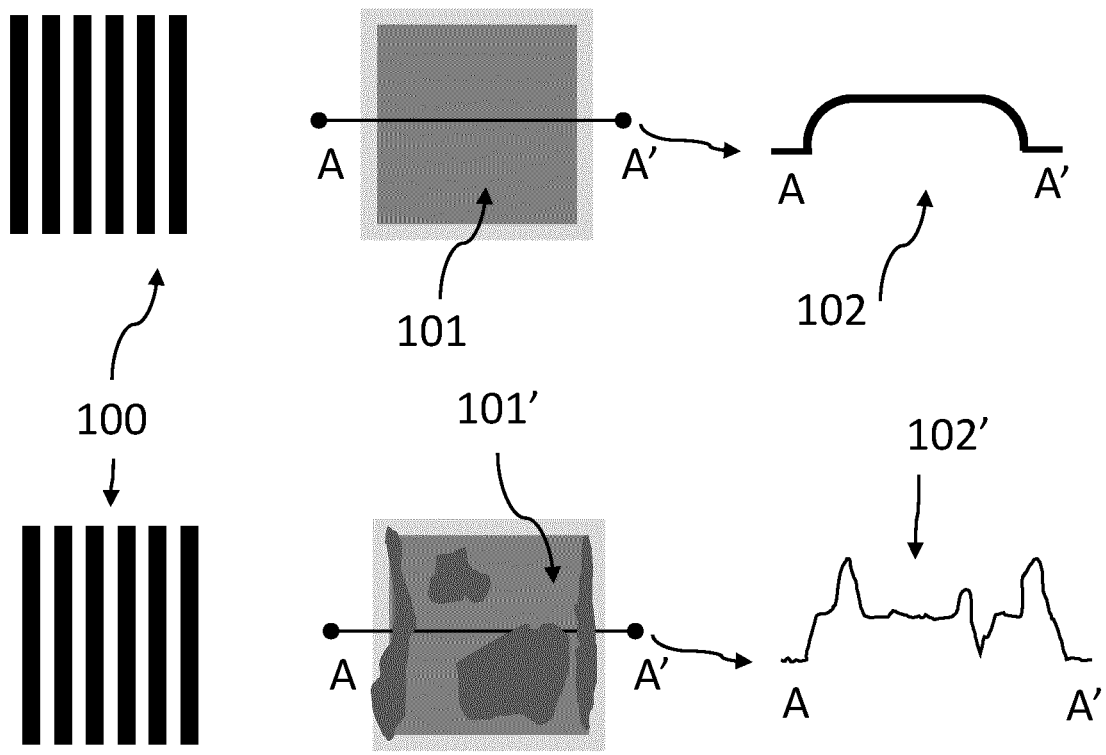
FIG. 1 depicts a grating suitable for dark field metrology with element 100, according to some aspects.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION OF THE INVENTION

FIG. 1 depicts a sketch of a grating suitable for dark field metrology with element 100. It is known that continuous shrinking of the semiconductor devices leads to stronger effect of the semiconductor devices process on the metrology targets, as smaller targets are easily affected by the smallest variations in said processing conditions. Top row in FIG. 1, in elements 101 and 102, depict an ideal case of an image, element 101, image measured with a dark field metrology tool, and a cross-section AA' of element 101. It is observed that the relatively flat, and, in order to extract overlay, known methods determine a region of interest (ROI) as the average intensity of the darker gray area of element 101. A real image measured is more similar to the sketch depicted by element 101' of FIG. 1. The image does not have any more a seemingly smooth surface, but there are variations in said image, and, as depicted in element 102' of FIG. 1, such variation could be quite extensive, in particular visible for highly damaged targets. Such targets may not be discarded, as they may pertain to important processes of the manufacturing of the semiconductor device, for which metrology is essential, i.e. there are situations where a reliable metrology is needed, despite the quality of the measurement. For the cases depicted by image 101' and cross-section 102', standard overlay measurement based on the average value of the pixels renders an in-accurate overlay measurement. Further, for extreme cases, as sketchily depicted in FIG. 1 in 101' and 102', calculating an ROI is rather impossible.

It is an object of the present invention to provide a method to select a ROI such that standard dark field metrology may be used. The method comprises receiving an image from a metrology tool, determining individual units of said image and discriminating the units which provide accurate metrology values.

Figure 2A:
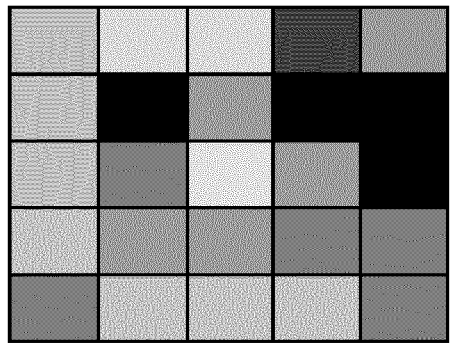
FIG. 2A depicts two measured images on a grating suitable for metrology of semiconductor devices, according to some aspects.
Figure 2A:
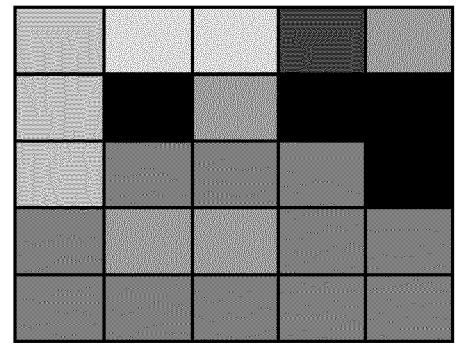
Figure 2B:
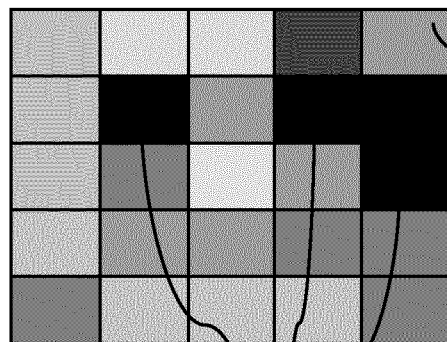
FIG. 2B depicts discriminating algorithms for multiple wavelengths that may be guided to specific areas of the measured image, according to some aspects.
Figure 2B:
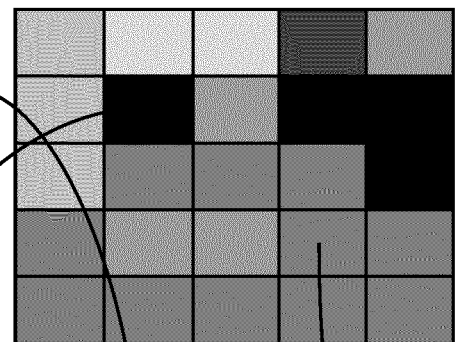
Figure 2B:
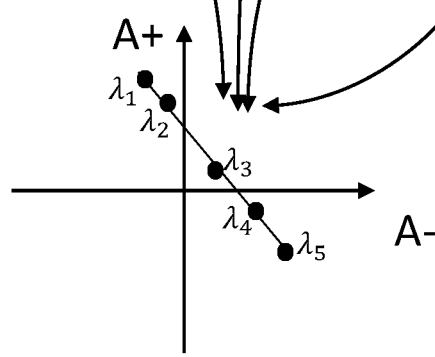
Figure 2B:
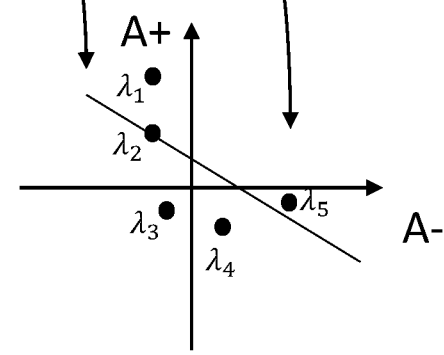

FIG. 2A depicts two measured images on a grating suitable for metrology of semiconductor devices. The grating may be an overlapping grating, or it may be a single grating. A single grating may be measured prior to the lithographic step. In such case, the information measured is representative for the bottom grating of an overlapping metrology target typically used in after-develop (post lithographic step) case. Elements 201' and 202' depict sketches of typically measured image in a metrology tool. Each unit in elements 201' and 202', defined by a single colour and no inner borders, may be a single pixel in a measured image. The measured image may comprise 900 by 900 pixels, for example. The method applies to any combination or size of a measured image. For simplicity, elements 201' and 202' depict only a few pixels in order to illustrate the concepts of the invention. Each pixel in 201' and 202' has a different color, which represent the intensity measured with said pixel. For badly damaged targets, the variations between pixels are pronounced. It is observed that pixel might form regions of similar values. In an embodiment, the images of 201' and 202' represent the images obtained from negative biased (201') and positive biased (202') metrology targets. In such cases, if there are regions with similar values between these two images, one may assume that said pixels are invariant, or little affected, by the processing conditions. In such case, by selecting only pixels with similar values for both negative and positive images, and employing standard overlay processing methods, accurate overlay may be measured. In an embodiment, a pre-litho metrology step may be employed to provide images such as those depicted in 201' and 202'. After identifying pixels, or regions of pixels with similar values, the information if feed-forward to the metrology step employed in the after develop process step. It facilitates a faster selection of relevant pixels for overlay measurement, as brute force selection of relevant pixels, wherein discriminating algorithms as depicted in FIG. 2B in 203 and 204, for multiple wavelengths, may be guided to specific areas of the measured image. The darkest colored pixels represent pixels for which accurate overlay may be measured with standard dark field metrology methods. Lighter pixels represent intensity values polluted by nuisance signal due to processing effect artefacts.

In an embodiment, the method may be utilized in discriminating the contribution of different processing effects on the metrology target. In an example, a processing tool A may affect only the edges of the metrology target, whereas processing tool B may affect only the center of the metrology target. It is expected that different processing conditions of the two different tools may result in different regions of pixels with different intensity values which may be differentiating using the above mentioned methodology.

In further embodiment, similarity in overlay between pixels may be employed in selecting which pixels need being feed-forwarded. This embodiment provides therefore a method of selecting an ROI. Furthermore, each pixel contribution to the final ROI may be weighted, wherein the weight may be an weighted average of the intensity of the area of the pad of interest.

In an embodiment, images of a metrology target are measured at multiple wavelengths. Afterwards, a selection algorithm is executed on the set of data. The set of data may be, for example, a 3D cube of data comprising images having 900 by 900 pixels measured at multiple wavelengths, 10 to 100 wavelengths typically. The algorithm depicted in 203 and 204 provides a selection for each pixel, wherein "good" pixels display a linear behaviour in A+/A− coordinated, and "bad" pixels display a non-linear behaviour. A+ is the asymmetry between for + and − first orders measured on a positive biased target, whereas A− is the same asymmetry measured for a negative biased target, A+/A− algorithm being well known in the state of the art.

In an embodiment, in order to select a few wavelength suitable for accurate overlay measurement, one may perform a dual wavelength measurement. Afterwards, the remaining range of available wavelengths, (total −2), is split in N intervals wherein N is the remaining number of wavelength after we subtract 2 from the number of maximum wavelength that we intend to use. The wavelengths in each interval are used in combination with wavelength in different intervals, thus reducing the dimensionality of the combinatorial space by several orders of magnitude.

While much of the discussion has focused on target structures as metrology targets specifically designed and formed for the purposes of measurement, in other embodiments, the target may be a functional part of devices formed on the substrate. Many devices have regular, periodic structures akin to a grating. The term "target", "grating" or "periodic structure" of a target as used herein does not require that the applicable structure has been provided specifically for the measurement being performed.

In an embodiment, the target may be realized using a patterning device (such as a reticle or mask) designed to produce the target on a substrate (e.g., create the pattern image for projection onto a resist layer, which patterned resist layer is used to form the target using subsequent processing steps such as deposition, etching, etc.)

In association with the physical structures of the targets as realized on substrates and patterning devices (such as a reticle or mask), an embodiment may include a computer program containing one or more sequences of machine-readable instructions and/or functional data describing the target design, describing a method of producing a target on a substrate, describing a method of measuring a target on a substrate and/or describing a method of analyzing a measurement to obtain information about a patterning process (e.g., a lithographic process, an etching process, etc.). This computer program may be executed for example within a processing apparatus of a lithographic apparatus or lithocell or a metrology or inspection apparatus or on a stand-alone computer. There may also be provided a data storage medium (e.g., semiconductor memory, magnetic or optical disk) having such a computer program stored therein. Where an existing metrology or inspection apparatus is already in production and/or in use, an embodiment can be implemented by the provision of an updated computer program product for causing a processor to perform one or more of the methods described herein. The program may optionally be arranged to control the apparatus and the like to perform a method as described herein. The program can update the lithographic and/or metrology recipe for measurement of substrates. The program may be arranged to control (directly or indirectly) the lithographic apparatus for the patterning and processing of substrates.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Although specific reference may have been made above to the use of embodiments in the context of optical lithography, it will be appreciated that embodiments of the invention may be used in other applications. For example, embodiments may be with imprint lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Further, the embodiments here can be used with any process that creates a structure and so could be used with, e.g., other material removal processes or with an additive process.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

Unless specifically stated otherwise, as apparent from the discussion, it is appreciated that throughout this specification discussions utilizing terms such as "processing," "computing," "calculating," "determining" or the like can refer to actions or processes of a specific apparatus, such as a special purpose computer or a similar special purpose electronic processing/computing device.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must).

The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The descriptions above are intended to be illustrative, not limiting. Thus, it will be apparent to one skilled in the art that modifications may be made to the disclosure as described without departing from the scope of the claims set out below and the breadth and scope of the present invention should not be limited by any of the above-described exemplary embodiments, but should be defined only in accordance with the following claims and their equivalents.

The invention claimed is:

1. A method comprising:
   receiving an image from a metrology tool,
   determining individual units of the image; and
   discriminating the individual units which provide accurate metrology values,
   wherein discriminating the individual units is based on finding linear dependence between measured intensities for each individual unit at multiple wavelengths.

2. The method of claim 1, wherein the determining the individual units comprises determining individual pixels.

3. The method of claim 1, wherein the individual units of the image are pixels, and the discriminating the individual units is based on comparing intensity values of each pixel with the intensity values of other pixels.

4. The method of claim 1, wherein the image is obtained by measuring a metrology target with multiple wavelengths and recording a scattered radiation from the metrology target.

5. The method claim 1, wherein the image from the metrology tool is the image obtained for a positive biased metrology target or the image obtained for a negative biased metrology target.

6. The method according of claim 1, wherein the image is measured in a pre-lithography step.

7. A method of selecting a region of interest in an image comprising:
   measuring the image of a metrology target by illuminating the metrology target with radiation;
   determining individual units of the image;
   discriminating the individual units of the image; and
   selecting pixels that form the region of interest, wherein the selected pixels have a degree of similarity as determined in the discriminating step, and
   wherein discriminating the individual units is based on finding linear dependence between measured intensities for each individual unit at multiple wavelengths.

8. The method of claim 7, wherein the determining the individual units comprises determining individual pixels.

9. The method of claim 7, wherein the individual units of the image are pixels, and the discriminating the individual units is based on comparing intensity values of each pixel with the intensity values of other pixels.

10. The method of claim 7, wherein the image is obtained by measuring a metrology target with multiple wavelengths and recording a scattered radiation from the metrology target.

11. The method claim 7, wherein the image from the metrology tool is the image obtained for a positive biased metrology target or the image obtained for a negative biased metrology target.

12. The method according of claim 7, wherein the image is measured in a pre-lithography step.

* * * * *